United States Patent [19]

Miller

[11] Patent Number: 4,499,853
[45] Date of Patent: Feb. 19, 1985

[54] DISTRIBUTOR TUBE FOR CVD REACTOR
[75] Inventor: Edward A. Miller, Yardley, Pa.
[73] Assignee: RCA Corporation, New York, N.Y.
[21] Appl. No.: 559,720
[22] Filed: Dec. 9, 1983
[51] Int. Cl.³ ............................................. C23C 13/08
[52] U.S. Cl. .................................... 118/725; 118/730; 118/715; 427/255.5
[58] Field of Search .............. 118/730, 729, 725, 715; 427/255.5

[56] References Cited
U.S. PATENT DOCUMENTS

| 3,672,948 | 6/1972 | Foehring et al. | 118/729 X |
| 4,062,318 | 12/1977 | Ban et al. | 118/49 |
| 4,082,865 | 4/1978 | Ban et al. | 427/253 |
| 4,401,689 | 8/1983 | Ban | 427/45.1 |

OTHER PUBLICATIONS

R. V. D'Aiello et al., "The Growth and Characterization of Epitaxial Solar Cells on Resolidified Metallurgical-Grade Silicon," RCA Review, vol. 44, 3, (1983), pp. 30-32 and 40-47.

Primary Examiner—John D. Smith
Assistant Examiner—Bernard F. Plantz
Attorney, Agent, or Firm—Birgit E. Morris; Donald S. Cohen; Joseph D. Lazar

[57] ABSTRACT

An apparatus for chemically vapor-depositing silicon material on surfaces of a plurality of substrates arranged in a stack that is continuously rotating. A gas distributor formed of a pair of coaxially tubes, in fixed relation with the rotating substrates, provides a pair of gas streams from a pair of parallel slots extending lengthwise of the tube facing the substrates. Gas input through the inner tube is passed through holes conducting gas from the inner tube to the outer tube and into the chamber as two gas streams. Substantially uniform deposition is achieved within ±5% with gas high deposition rates effected by high flow gas streams that are not turbulent.

4 Claims, 2 Drawing Figures

DISTRIBUTOR TUBE FOR CVD REACTOR

This invention relates to chemical vapor deposition (CVD) reactors and more particularly to a novel distributor tube of the gaseous compound used in the reactor.

BACKGROUND OF THE INVENTION

Chemical vapor deposition (CVD) is a method of forming a layer of material on a substrate, such as an epitaxial layer on a silicon wafer, wherein deposits are produced by heterogeneous gas-solid or gas-liquid chemical reactions at the surface of the substrate. One form of structure for achieving CVD processing is a rotary disc reactor in which a number of stacked parallel graphite discs serving as susceptors carry silicon wafers on one or both sides of the discs is described in U.S. Pat. Nos. 4,062,318 and 4,082,865 issued Dec. 13, 1977 and Apr. 4, 1978, respectively. The stacked susceptor structure is enclosed within a quartz tube surrounded by an RF induction heating coil. A gas manifold is provided with a plurality of gas nozzles for the injection of the gas into peripheral proportions of the stacked discs. The gas manifold and thus the nozzles in prior art rotary reactor structures are oscillated to spread the gas plume uniformly over the surface of the susceptor discs and wafers carried on the discs. The RF coil inductively heats the graphite discs by inductive process through the wall of the quartz tube.

The gas carrying the material is conveyed into the reaction chamber by means of gas tube manifolds that are provided with slots, openings or nozzles that are positioned to generate gas streams that flow over the surface of the wafers or substrates. In typical rotary disc reactor apparatus, the gas manifold tubes are oscillated to sweep a gas stream over the rotating wafers or substrates. See, for example, U.S. Pat. No. 4,082,865 for a gas manifold using a single tube with nozzles for generating the gas streams. See also U.S. Pat. No. 4,401,689 for apparatus using a coaxial gas manifold tube means wherein the gas is first introduced into the chamber through an inner tube and then passed to an outer tube or shroud which provides a gas stream through a series of holes or slots while the tube is oscillated back and forth over the surface of the wafers or substrates.

The use of slotted, oscillating gas manifolds have been used with certain degrees of success with wafers of limited size, on the order of 2½ to 3 inches in diameter. However, the uniformity of thickness and the growth rates of such single slot gas manifold tubes are limited by the maximum gas velocity that they can handle without developing turbulence and poor deposition properties.

SUMMARY OF THE INVENTION

According to the present invention, an apparatus for chemically vapor depositing a material onto stacked substrates in a rotary disc reactor includes a first tube for carrying the gas into the chamber and a second tube coaxially disposed about the first tube. Gas is passed from the first tube to the second tube by means of a plurality of longitudinally spaced openings. The second tube is provided with at least two slots extending lengthwise of the tube and facing in the direction of the stacked substrates. The tubes are in fixed position relative to the substrates which are rotated during the deposition process. The width of each slot in the tube is selected so that the velocity of the gas streams flowing through the slots is substantially free or turbulence whereby the thickness of the deposit material is substantially uniform and the deposition rate of the material on the substrates can be significantly high on the order of 1.5 to 2 micrometers per minute. The thickness of the deposited material is uniform to within ±5%.

DETAILED DESCRIPTION OF A PREFERRED EMBODIMENT

Figure 1:
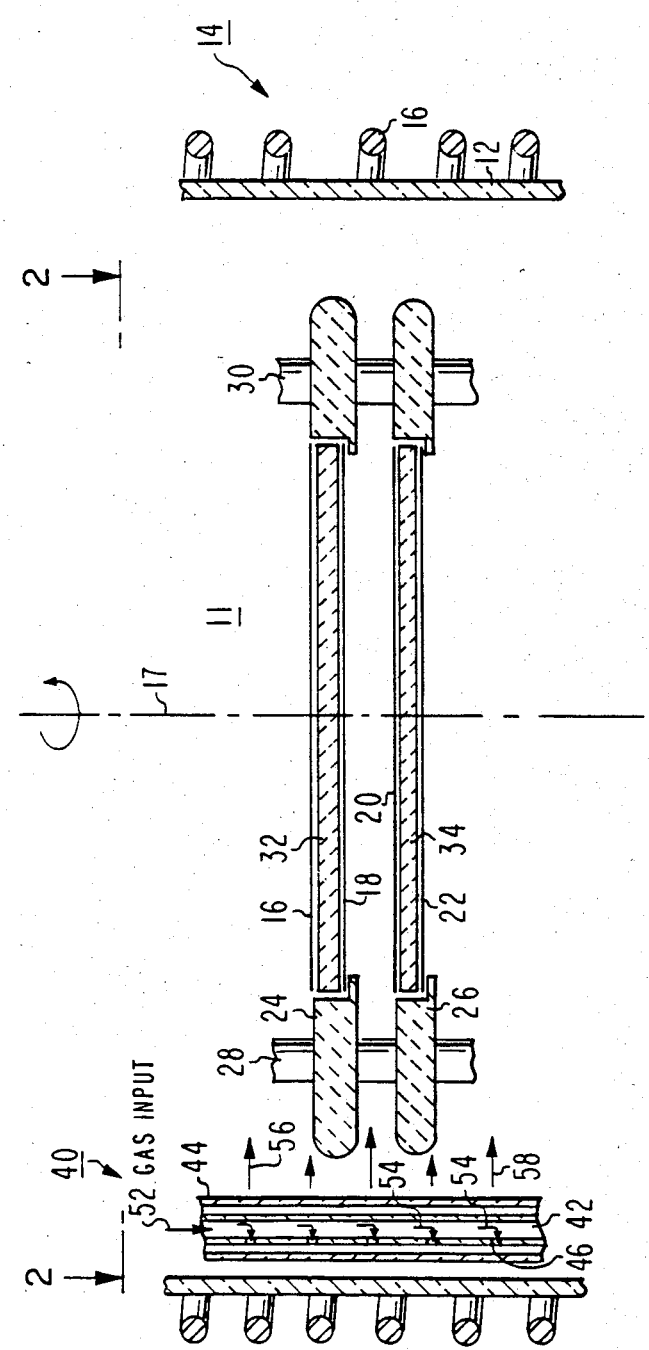
FIG. 1 is a fragmentary view of a rotary disc reactor embodying the present invention.

Refer to FIG. 1 in which there is shown a fragmentary portion of a typical rotary disc reactor of the type described in detail, for example, in U.S. Pat. No. 4,082,865 identified above and incorporated herein by reference. The reaction chamber 11 is formed by a housing 12 typically formed of quartz material about which is provided RF coil 14 formed of a plurality of turns 16. The RF coil 14 is suitably energized with RF current according to conventional design. The plurality of substrates, typically wafers 16, 18, 20 and 22, are supported in pair relation on a graphite susceptor 24, 26, etc., each supported on suitable supported posts 28 and 30. Typically at least three such posts are needed to support the stack of wafers. Each pair of wafers sandwiches a center plug 32, 34, etc., to provide structural strength to support the wafers and to provide good conductivity of heat generated in the susceptors in response to RF energy from the coils 14. A gas distributor 40 is located adjacent the stacked array of wafers in a fixed position and extending longitudinally of the chamber 14 and parallel to the axis of rotaton 17 of the stacked array of wafers. The distributor 40 is formed of an outer tube 44 and an inner tube 42 in coaxial relation with each other. The inner tube 42 carries the gas input as indicated by arrow 52. The inner tube 42 is provided with a series of holes 46 located along a common longitudinal path with a pitch or spacing of about ten holes per inch, each hole having a diameter of 0.05 inch. The holes 46 are positioned so as to pass the gas along the paths 54 as shown in FIG. 1 from the main gas stream 52 to strike the inner wall of the outer tube 44 and be deflected towards the slots 48 and 50 provided in the outer wall of the outer tube 44 as seen better in FIG. 2. The gas streams 56 and 58 exiting through the slots 48 and 50 are represented by arrows.

Each of the slots 48 and 50 are formed in the outer wall of the tube 44 to extend continuously from the bottom to the top of the stacked array of wafers 16, etc. The slots are typically 0.125 to 0.250 centimeters (0.05 to 0.10 inch) wide and for a stacked array of 20 wafers will be about 17.8 centimeters (7 inches) long.

Figure 2:
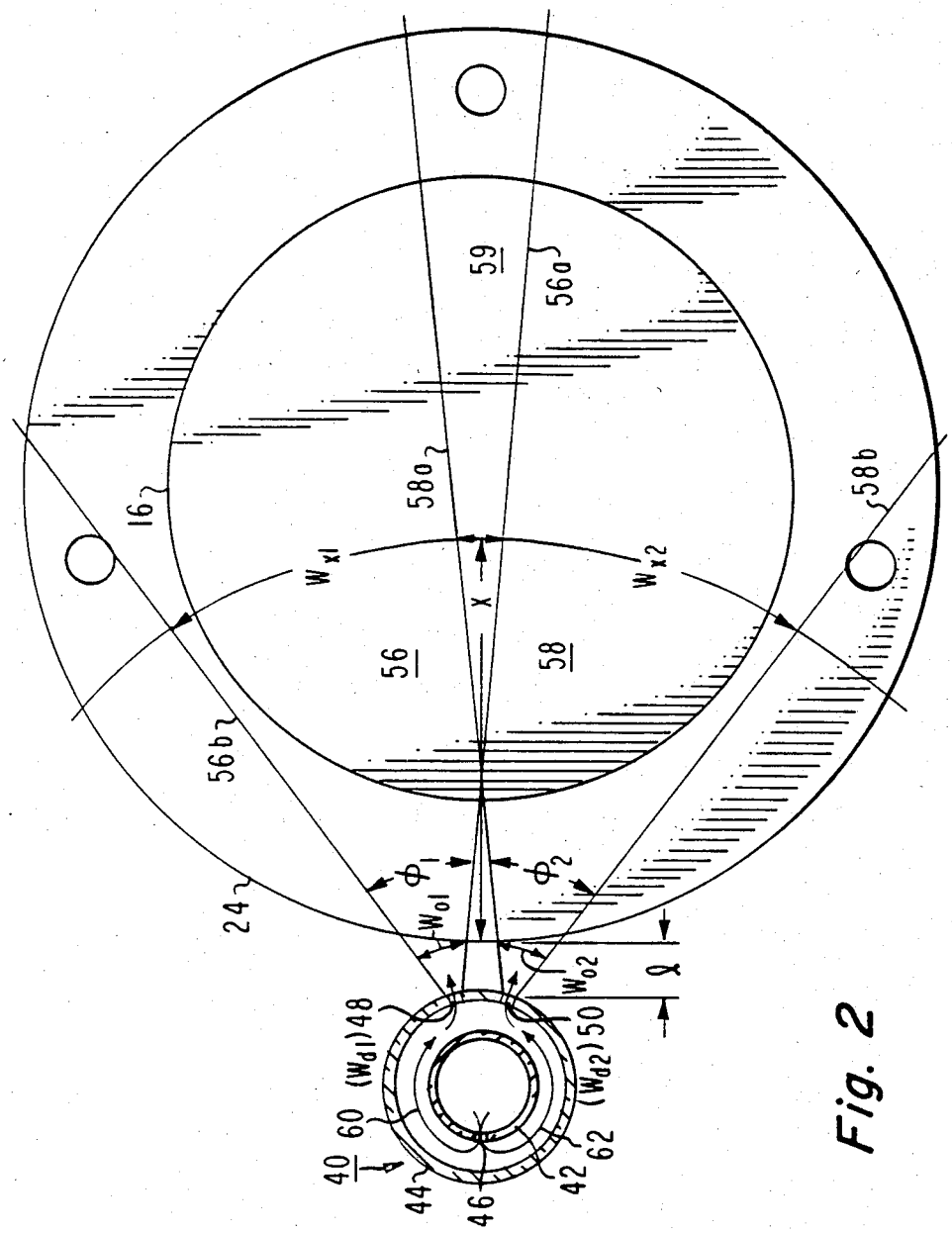
FIG. 2 is a plan view of one substrate in operative relation with the distributed tube shown in FIG. 1 as seen along viewing line 2—2 of FIG. 1.

In the typical operation of the apparatus, a stack of wafers 16, etc., typically 20 in number, will be rotated about axis 17 while gas 52, preferably silicon tetrachloride ($SiCl_4$) in a vehicle of hydrogen is passed into the chamber 11. Typically, the content of silicon tetrachloride is in the range of 1 to 2 percent of the total hydrogen and source gas content. The pressure of the gas is slightly above atmospheric and is typically 1.4 or 1.5 of atmospheric pressure (18 psi). The gas is passed downwardly through the inner tube 42 and exits through the plurality of holes 54 to pass within the tube as shown by the arrows 60 and 62, as shown better in FIG. 2. The gas then exits through the respective slots 48 and 50 to develop two gas streams 56 and 58 as shown in FIG. 2. The angle of the respective gas streams exiting from the slots depends upon the relative position of the slots to the wafer surface and to the spacing between each slot. The manner in which these slots are arranged will now be better understood by the following explanation.

The gas exiting each of the slots 48 and 50 develops a spreading angle $\phi$ as shown in FIG. 2. The subscripts 1 and 2 to the parameter being described merely distinguish one slot from the other. Otherwise, the parameters are equal. The spread arc, at a finite distance from the slot, is defined as $W_o$. The arcuate distance $W_o$ is represented by the following equation:

$$W_o = W_d + 2l \tan \phi \qquad (1)$$

wherein $W_d$ is the arcuate distance at either of the slots 48 and 50, $l$ is the distance from the slot exit to the edge of the susceptor 24, and $\phi$ is the spreading angle. Subscripts 1 and 2 are used on the drawing as just mentioned to identify the parameter related to the respective gas streams developed from the slots 48 and 50.

As the gas stream passes over the surface of the wafer 16, the arcuate spreading distance increases as shown at the center of the wafer by the spreading arc $W_x$. This spreading arcuate length can be described by the following equation:

$$W_x = W_o + 1.85 \left( \frac{D \cdot x}{V_A} \right)^{\frac{1}{2}} \left( \frac{x}{W_o} \right)^{\frac{1}{4}} \qquad (2)$$

wherein D is the diffusion coefficient at a temperature T, $V_A$ is the average gas velocity, x is the distance across the wafer 16 including the width of the susceptor 24, and $W_o$ is the arcuate width of the gas stream as defined by equation (1).

For a given design of a reactor, in the practice of the invention, the desired gas delivery will develop a gas velocity depending upon the size, essentially only the width, of the slots 48 and 50. According to general fluid mechanic relationships, the mass gas flow can be represented by the following equation:

$$Q = (V) \times (A) \qquad (3)$$

wherein Q is the mass of the volumetric flow of the gas in liters per minute, V is the velocity of the gas exiting from the respective slots 48 and 50 and A is the area, i.e., the width×length of the slots 48 and 50.

Thus, according to equations (1) and (2), for a given gas flow Q, a slot 48 or 50 of width ($W_d$) will produce a spread of the gas stream $W_x$ at the center of the wafer 16 as shown in FIG. 2. The edges of the susceptor 24 will disturb the gas flow slightly but will not change the direction of the gas flow. Moreover, the gas flow will produce a particular, specific gas velocity across the wafer 16. It is clear, that since the gas spreads across the surface, the deposition of the desired material specie from the gas flow will not deposit uniformly on the wafer. As the wafer 16 is rotated in the reactor during the deposition of the gas, the inherent non-uniformity due to the spreading of the gas is partially reduced. Nevertheless, experiments have shown that the growth of the material on the wafer is consistently thicker on the center of the wafer and thinner on the edge of the wafer. It has also been determined by experiment that a single slot in the tube distributor 40 pointing at the center of the rotating wafer results in a growth rate that varies as a function of the gas velocity wherein the non-uniformity is greatest at the higher velocities. The growth rate is more uniform with lower gas velocities with a consequence, however, that the growth rate is inefficient since it is rather slow. It appears that these low growth rates (e.g., 0.6 $\mu$m/minute at the edge and 0.2 $\mu$m/minute at the center) with a relatively low velocity of the gas (e.g. 450 cm/sec) is caused by much of the chemicals being decomposed at the leading edge of the portion of the susceptor 24 nearest the exiting slots 48 and 50.

In the prior art to improve the growth rate, the distributor 40 was arranged to be oscillated from side to side in a modulated sweep mode, as described for example in the above-identified patents. In such an oscillation mode, the gas stream approaches the edge of the wafer 16 and cuts across the edge of the wafer before a large amount of the source gas can be heated by the susceptor 24 at temperatures that increase typically from 700° C. to the desired 1150° C. at which epitaxial deposition will be achieved.

In order to optimize chemical efficiency, that is, to place as much silicon from the source gas to provide epitaxial growth on the substrate or wafer 16, the distibutor slot 48 or 50 for designs using only single slots should be pointed directly at the center of the wafer. In experiments performed with such a distributor in which only one slot was used, the development of the epitaxial deposition resulted in a non-uniform growth rate of 1.5 micrometers in the center portion of the wafer and 0.9 micrometers at the edges. One reason for this non-uniformity in growth rate can be based on the geometry of the arrangement and the temperature of the heating gas. In the geometry aspect of the problem, the gas stream is maintained in a direction across the center of the wafer while the edges of the rotating wafer pass momentarily in front of the gas stream whereby only a very small portion of the total exposure time is utilized. With respect to the temperature aspect of the problem, as the gas passes over the edge of the wafer 16 the temperature is cooler than the temperature of the gas passing towards the center. Under these conditions, the growth of the silicon is non-uniform such that the silicon deposits are thicker at the center than at the edges. It is clear that this non-uniform deposition rate is not desirable.

Both of these problems can be solved by, first, increasing the velocity of the gas whereby the growth rate region extends beyond the center to about three quarters of the diameter distance from the exiting slots. However, increasing the gas velocity above values of 700 centimeters per second shows that turbulence in the flow characteristics of the stream develop and moreover, severe cooling of the susceptor stack occurs. These effects have been observed in experiments using smoke mixed with the gas stream to show clearly the turbulence that results from higher gas velocities. According to the present invention, these problems have been solved by providing a plurality of parallel slots in the distributor 40, e.g., only two slots for smaller wafers and directing the gas stream from each slot so that the combination of gas streams just cover the entire wafer surface.

Thus the first gas stream 56 is arranged to be defined by limits 56a and 56b while the second gas stream 58 is arranged to be defined by the limits 58a and 58b as shown in FIG. 2. The overlapping region 59 will of course receive more gaseous material than the regions that are not overlapping. In the region 59, the quantity of gas in the wider portions of the spreading stream has less content of $SiCl_4$ than the narrower portions of the spreading angle. Therefore, the overlapping of two gas spreading angles does not adversely affect the growth rate. Nevertheless, the growth rate in the region 59 can be decreased if desired by decreasing the velocity ($V_A$) of the gas exiting from the slots.

Several experiments were performed to make a comparision between the results of a tube having only one slot as compared to a tube having two slots. These experiments were performed on a four inch square wafer in which the gas flow conditions were the same. Gas was provided to the system at 200 liters per minute at which about 98% of the gas was hydrogen and about 2% was silicon tetrachloride. The width of the respective slots are as shown in the following table resulting in gas velocities of 600 centimeters per second at location $W_o$ for a single slot and 400 centimeters per second for each of the respective two slots.

| | | GROWTH RATE ($\mu$m/sec) | | | |
|---|---|---|---|---|---|
| | | LOCATION ON SQUARE WAFER (10.16 cm. per side) | | | |
| | Distributor (40) | Edge | R/2 | Center | Corner |
| 1 Slot | (0.165 cm) | 0.85 | 1.05 | 1.45 | 0.76 |
| 2 Slots | (0.010 cm) | 1.49 | 1.55 | 1.59 | 1.53 | where R/2 is located ½ the distance between the center and an edge.

It is seen from the above table that the two-slot distributor 40 provides epitaxial growth uniformity rate that is much greater than the average total growth rate for a single slot distributor thereby greatly increasing chemical efficiency. The uniformity from the two-slot distributor was within ±5% on all of the measured positions as shown in the table.

In the practice of the invention, growth rates of 1.0 to 2.0 micrometers per minute have been achieved with $SiCl_4$ at 1 to 2% volumetric concentration in hydrogen with ±5% thickness uniformity. However, higher growth rates can be achieved with suitable design and operating conditions as will be apparent to those skilled in this art according to the teachings herein.

In a typical operaton of the system using two parallel slots, the gas flow is 250 liters per minute with each slot having a width of 0.10 centimeters resulting in a gas velocity starting at the edge of the rotating wafers near the tube of 700 centimeters per second. Tests have shown that virtually no turbulance was present in the gas streams and the deposition thicknesses were within ±5% from each other across all useful portions of the wafers.

What is claimed is:

1. An apparatus for chemically vapor-depositing a material onto surfaces of a plurality of substrates spaced apart in a stacked parallel array within a reaction chamber, wherein said substrates are heated while contacting said surfaces with a gaseous compound of said material to be deposited, said apparatus having means for rotating said substrates about an axis perpendicular to said substrates, and coaxial tubular means extending parallel to said substrate axis for providing a flow of gas carrying said material, the improvement wherein:
    said coaxial tubular means comprises a first inner tube fixed coaxially within a second outer tube in fixed position within said chamber;
    said first tube having a plurality of openings located along a path extending longitudinally along the surface of the first tube to direct gas in a plurality of gas streams to the inner wall of said second tube;
    said second tube having at least two slots parallel to each other and extending longitudinally along the surface of the second tube facing said substrates to provide at least two overlapping gas streams directed towards said stack of substrates such as to pass through the spacing between the substrates and pass over the surfaces of said rotating substrates, the width of each slot being selected so that the velocity of the gas streams flowing through said slots onto said substrates is substantially free of turbulence, whereby the thickness of the deposited material on each substrate surface is substantially uniform and the deposition rate can be significantly high.

2. The apparatus of claim 1 further including means for controlling the volumetric rate of gas flow of about 250 liters per minute to a maximum velocity of about 700 centimeters per second without turbulence through said tubes wherein the width of each tube is such that the thickness of the deposited material is uniform over the surface of each of said surfaces to within ±5%.

3. The apparatus of claim 1 further including means for providing said gaseous compound such that said gas contains about 1 to 2% by volume of silicon tetrachloride and further including means for controlling the volumetric rate of gas flow through said tube to a maximum velocity without turbulence such that said deposition rate is within the range 1.0 to 2.0 micrometers per minute.

4. The apparatus of claim 1 wherein said second tube has three slots extending longitudinally along the surface, each slot extending parallel to the other two slots and positioned so that three partially overlapping gas streams are directed to said substrates.

* * * * *